(12) United States Patent
Cichonski

(10) Patent No.: US 10,126,338 B2
(45) Date of Patent: Nov. 13, 2018

(54) SYSTEM AND METHODS FOR ADAPTIVE POWER CONSUMPTION BASED ON SOURCE IMPEDANCE

(71) Applicant: Advanced Digital Broadcast S.A., Pregny-Chambesy (CH)

(72) Inventor: Dariusz Cichonski, Zielona Gora (PL)

(73) Assignee: Advanced Digital Broadcast S.A. (CH)

( * ) Notice: Subject to any disclaimer, the term of this patent is extended or adjusted under 35 U.S.C. 154(b) by 177 days.

(21) Appl. No.: 14/984,934

(22) Filed: Dec. 30, 2015

(65) Prior Publication Data

US 2017/0192041 A1    Jul. 6, 2017

(51) Int. Cl.
*G01R 11/63* (2006.01)
*G01R 19/00* (2006.01)
*G01R 21/133* (2006.01)
*G06F 13/20* (2006.01)
*G01R 27/14* (2006.01)

(52) U.S. Cl.
CPC ............ *G01R 21/133* (2013.01); *G01R 27/14* (2013.01); *G06F 13/20* (2013.01); *Y02D 10/14* (2018.01)

(58) Field of Classification Search
CPC ........ G01R 21/133; G01R 27/14; G06F 13/20
USPC ......... 324/76.11, 76.61, 76.69, 76.74, 103 R
See application file for complete search history.

(56) References Cited

U.S. PATENT DOCUMENTS

| 6,617,972 | B2 * | 9/2003 | Takarada | ........... G08B 21/0484 |
| | | | | 324/538 |
| 7,420,293 | B2 | 9/2008 | Donnelly et al. | |
| 8,178,997 | B2 | 5/2012 | Talkin et al. | |
| 8,201,000 | B2 | 6/2012 | Boss et al. | |
| 8,731,731 | B2 | 5/2014 | Nakai | |
| 8,779,729 | B2 * | 7/2014 | Shiraishi | ............ G01R 31/3606 |
| | | | | 320/134 |
| 2012/0098518 | A1 * | 4/2012 | Unagami | ............. G01R 22/066 |
| | | | | 324/74 |
| 2017/0060150 | A1 * | 3/2017 | Stefanski | ............... G05D 23/27 |
| 2018/0036740 | A1 * | 2/2018 | Nelson | .................... B02C 19/18 |
| 2018/0059176 | A1 * | 3/2018 | Ding | .................. G01R 31/2891 |

* cited by examiner

*Primary Examiner* — Giovanni Astacio-Oquendo
(74) *Attorney, Agent, or Firm* — Krishna Kalidindi

(57) ABSTRACT

A method for determining power consumption levels of an appliance includes reducing a power consumption of the appliance to a minimum value; measuring a first voltage value at an internal terminal of the appliance; increasing the power consumption of the appliance to a factory default value; measuring a second voltage value at the internal terminal of the appliance; computing a supply wire resistance based on the measured first and second voltage values; and determining a maximum allowable power consumption value of the appliance based on the computed supply wire resistance.

19 Claims, 2 Drawing Sheets

SYSTEM AND METHODS FOR ADAPTIVE POWER CONSUMPTION BASED ON SOURCE IMPEDANCE

BACKGROUND

The demand for electrical power around the world continues to grow for many reasons. The number of devices that use electricity as an energy source has increased. The number of devices or appliances within a home has also increased. There is also an increase in power requirements from one or more of such appliances. For example, an electric kettle that can boil water in a shorter amount will have a higher power than another kettle that takes a longer amount of time to boil the same volume of water. The kettle boiling water in a shorter period of time is more desirable for consumers. Other appliances consuming power in the kilowatt range can include, but are not limited to, a dishwasher, an induction stove, a water heater and a clothes dryer.

Such increased requirement poses a problem to an existing electrical grid within a household or premises. Certain factors limit the maximum power of devices to reasonable levels. In some regions of the world, such as in Europe for example, plugs that connect a device to a power outlet permit a maximum of 16 Amperes of current. A maximum power made available to a consumer (or a premise) may be fixed by contract between the consumer and the electricity provider such as a utility company. The diameters of wires in an (household) electrical grid can also determine (or limit) the maximal power that can be provided by the particular wire.

In order to avoid wire overload problems, some manufacturers of household appliances use presets for limiting the maximum power consumed by the device. These presets can be setup during installation of the appliances. Most consumers, however, are unfamiliar with electricity and lack the knowledge to correctly setup the presets.

A need exists, therefore, for systems, devices and methods for overcoming, inter alia, the shortcomings identified above.

SUMMARY

In an exemplary embodiment, an apparatus for determining power consumption levels of an appliance is disclosed. The apparatus comprises: a measuring unit for measuring voltage at internal terminals of the appliance; a memory unit for storing the measured values and for storing a factory default power consumption value of the appliance; a processor for computing a supply wire resistance based on the measured voltage values, determining a maximum allowable power consumption value of the appliance based on the computed supply wire resistance, and a communication bus for facilitating communication between the measuring unit, the memory unit and the processor.

In another exemplary embodiment, a method for determining power consumption (levels) of an appliance is disclosed. The method comprises the steps of: reducing a power consumption of the appliance to a minimum value; measuring a first voltage value at an internal terminal of the appliance; increasing the power consumption of the appliance to a factory default value; measuring a second voltage value at the internal terminal of the appliance; computing a supply wire resistance based on the measured first and second voltage values; and determining a maximum allowable power consumption value of the appliance based on the computed supply wire resistance.

DETAILED DESCRIPTION

Exemplary embodiments as described herein provide methods and devices for setting up the presets in an automatic and autonomous manner. A first measurement of voltage at an appliance may be made when the appliance is not consuming much energy such as when the appliance operation is initiated. In an induction stove, for example, this takes place when the device is connected to the home grid and the power to the device is switched on. This measurement may be made only when all engines and heaters are off. Power consumption for this measurement should be in a range of single digit Watt values or less (i.e. it is closer to 1 W than to 9 W). Due to environmental regulations, this could be in the range of 0.5 to 1 W.

A second measurement of voltage may be made when a significant load within the appliance is switched ON for a short time needed to perform this measurement. The term "significant" in this context may mean a kW range load such as 2 to 10 kW depending on the appliance. In the induction stove, this measurement can be made when the stove reaches its operating state such as when the coils are heated.

As the supply network has some internal impedance, the second voltage measurement (under load) value will be lower than the first voltage measurement value. The load, measured on appliance terminals excluding appliance cable resistance, in the appliance is known. The voltage drop across the wires in home and external grid can be calculated based on the difference between the first and second measurement. Based on the known load and computed voltage drop, a processor in the device or appliance could determine whether to reduce the power consumption of the device or appliance.

In some embodiments, if the voltage drop between the first and second measurements is higher than a pre-determined value or pre-determined threshold, the power may be reduced. The pre-determined value may be stored in the appliance memory. In some embodiments, the determination to reduce power may be based on a pre-set percentage drop (or percentage drop threshold) in the measured voltage value. The level of reduction may be directly proportional to the voltage drop. A practical real world triggering value may be about a 2% to 3% voltage drop.

The processor can also determine the level at which to set the maximal power consumption of the device or appliance. In some instances, the processor may determine that the level of power consumption for the particular device or appliance can be set at the highest possible value (i.e. the nominal power which is described below in further below).

Figure 2:
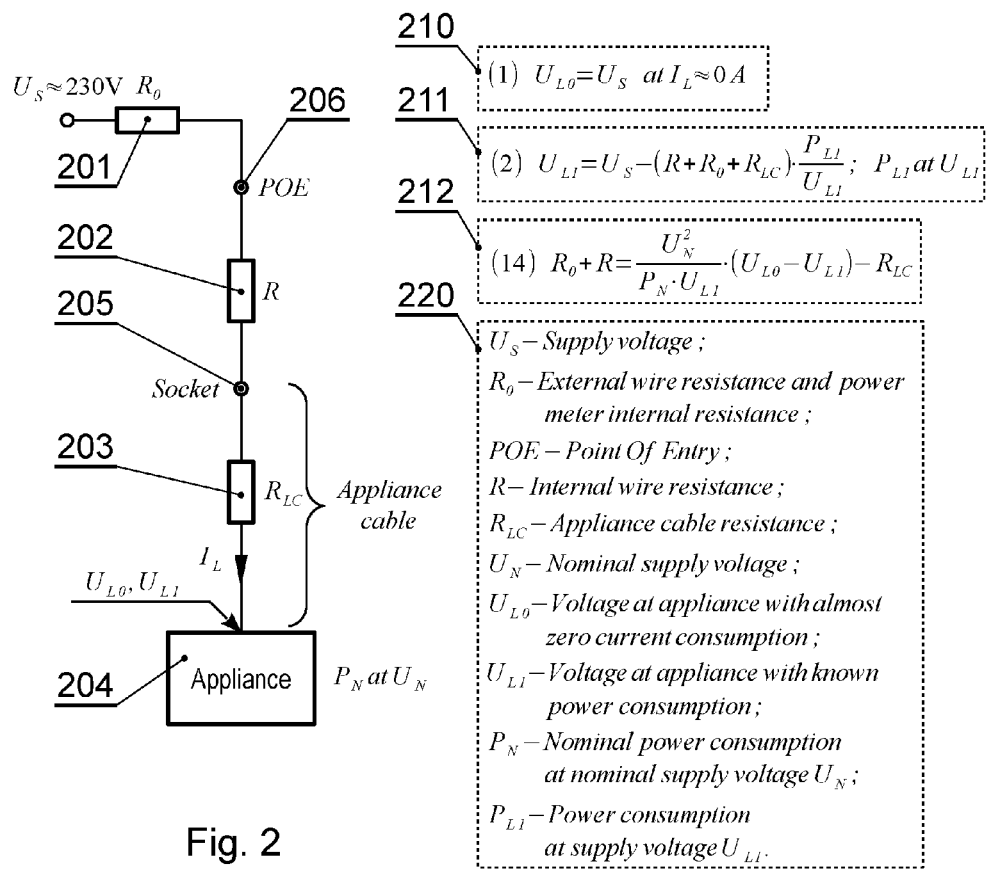
FIG. 2 illustrates a connection of a device to an energy grid in accordance with exemplary embodiments.

Exemplary embodiments may be described further with reference to the drawings. FIG. 2 illustrates a connection of an appliance 204 to an energy source such as the electric grid. External wire resistance including the electric meter resistance is represented by $R_0$. The point of entry POE 206 represents the "border" between an interior and an exterior wire of a premise or house. Resistance of wires inside a house between an electrical panel (internal energy distribution box not illustrated) and Socket(s) 205 on the wall is represented by R 202.

An appliance or device 204 has a supply cable that facilitates the connection of the respective device/appliance to a socket 205. The supply cable resistance is represented by $R_{LC}$ 203. $R_{LC}$ for each device/appliance is known to the manufacturer and can be stored in the appliance or device memory. The value of $R_{LC}$ can also be measured at the time the appliance or device is manufactured.

The nominal voltage $U_N$ may be approximately 230 volts in Europe and 110 volts in the United States (and in North America). This value can vary based on load conditions, etc. According to exemplary embodiments, the first voltage measurement takes place at the internal terminals of the appliance 204 at very low power consumption. Internal terminals in this context indicates terminals where the (power supply) cord is connected to the appliance. The purpose of this measurement is to measure the actual value of supply voltage $U_S$, which in a real world setting could be different from the nominal value of 110 V (in US or 230 V in Europe). At low power consumption, an assumption can be made that the voltage drop across $R_0$, R and $R_{LC}$ is very close to zero. Thus, the value of $U_{L0}$ can be approximately the same as the value of $U_S$ (i.e. $U_{L0} \approx U_S$) where $U_S$ is the actual supply voltage value at the time of measurement.

The voltage drop across each of $R_0$ 201, R 202 and $R_{LC}$ 203 are reduced (in contrast with when a load is connected). The current $I_L$ flowing into appliance 204 is negligible (due to low power consumption resulting from no load within the appliance being switched ON).

While the measured voltage value $U_{L0}$ may be approximately equal to the supply voltage $U_S$ with negligible load current, it can be assumed that these two values are equal due to small power consumption. Furthermore, the power consumption during the first measurement may be 1 W and 2 kW or more during the second measurement. As a result of such a high ratio (2000:1), such assumption of the values being equal is a safe assumption and well within acceptable measurement errors. The first measured voltage value, $U_{L0}$, (illustrated in the key to FIG. 2 as 20° and labeled as 210) may be expressed as:

$$U_{L0} = U_S \text{ at } I_L \approx 0 \text{ A} \quad (1)$$

The first measurement may be made the first time an appliance 204 is "plugged" into (a power) socket 205 and the power button of the appliance is actuated (or activated or moved) to the "on" position for example. The first measurement can also take place each time the appliance is plugged into a socket (after being plugged out for example). The appliance may recognize a "plugging out" event in order to recognize the subsequent "plugging in" event. That is, each "plugging in" event may serve as a trigger to take the first voltage measurement of the appliance. The first measured value may be designated as the reference value.

According to exemplary embodiments, a second measurement for voltage at appliance 204 may be made under significant load. The term significant in this context may imply a load in the range of 2 kW to 10 kW depending on the appliance. The term maximum power can be used instead (of significant load) which is equal to nominal power $P_N$. The use of maximum or nominal power is not unsafe since it is used during the measurement time which is short, in the 10 to 100 millisecond range.

In case of a resistive heater mounted in an electric kettle or in a washing machine, its (i.e. the heater's) resistance depends on temperature due to heater positive temperature coefficient of resistivity. This has an impact on power consumption during the heating process of the heater. In other words, a cold heater consumes more power than a hot one. This dependency is not strong in the temperature range in which exemplary embodiments operate in, but in order to reduce measurement errors, measurement should be done in repeatable condition defined by the appliance manufacturer that is knowledgeable about the load at measurement time. Typical resistive heater temperature coefficient of resistivity is in the range of 0.0004 per 1/K. If higher accuracy is required, the temperature of the heater may be measured.

Heater temperature value during the second voltage measurement allows a precise calculation of the load. In case of any kind of electric energy transformation, such in a microwave oven or induction stove for example, the measurement can be performed after transients. Transients in this context refer to a non-stable initial conditions such as during loading capacitors in an internal rectifier for example. Generally, the transients takes less than 1 second.

This may correspond to when an appliance is operating at full capacity for example. The second measurement may be designated as $U_{L1}$. The nominal power consumption $P_N$ is known since the appliance has pre-stored knowledge about its load value. Due to the increased power consumption, the (second measured) voltage $U_{L1}$ at the appliance is less than the first measured value $U_{L0}$. The second measured voltage value $U_{L1}$ (illustrated in the key to FIG. 2 as 2° and labeled as 211) may be expressed as:

$$U_{L1} = U_S - (R + R_0 + R_{LC}) \cdot \frac{P_{L1}}{U_{L1}} \quad (2)$$

$U_N$ is the nominal voltage supply value of 110 V in USA (or 230 V in Europe). Real or actual voltage supply value $U_S$ could be higher or lower than $U_N$. The value of $U_S$ can range from approximately −10% to +5% of nominal voltage $U_N$. $P_N$ is the nominal power @ $U_N$ and $P_{L1}$ is the power @ $U_{L1}$. The linear dependence of power consumption according to supply voltage may be assumed for the voltage range that is applicable to exemplary embodiments as described herein without having an impact on measurement accuracy. If the load is not linear, other calculations can be performed. Additionally, data regarding power consumption at different supply voltages can be stored in appliance or device memory. Such data could be in the form of equations or in the form of numerical values. This data may be used for appropriate calculations.

The steps needed to compute $R+R_0$ are illustrated in detail below. Since power can be a function of voltage and resistance, the nominal power may be expressed as:

$$P_N = \frac{U_N^2}{R_L}, \quad (3)$$

where $R_L$ is the load resistance that can be calculated from known $P_N$ and $U_N$ values.

The power at the second measurement may be expressed as:

$$P_{L1} = \frac{U_{L1}^2}{R_L}, \quad (4)$$

where $R_L$ remains constant (due to assumption of load linearity at different voltages) from the first measurement in equation (3) above.

Since $R_L$ remains constant between the first and second measurements, it can be expressed as:

$$R_L = \frac{U_N^2}{P_N} = \frac{U_{L1}^2}{P_{L1}} \qquad (5)$$

Simplifying equation (5) further yields the relationship:

$$\frac{U_N^2}{P_N} = \frac{U_{L1}^2}{P_{L1}} \qquad (6)$$

This can be rewritten to express $P_{L1}$ as:

$$P_{L1} = P_N \cdot \frac{U_{L1}^2}{U_N^2} \qquad (7)$$

Referring to equation (2) above, the second measured voltage $U_{L1}$ can be rewritten as:

$$U_{L1} = U_S - (R + R_0 + R_{LC}) \cdot \frac{P_N}{U_{L1}} \cdot \frac{U_{L1}^2}{U_N^2} \qquad (8)$$

This equation can be simplified as:

$$U_{L1} = U_S - (R + R_0 + R_{LC}) \cdot P_N \cdot \frac{U_{L1}}{U_N^2} \qquad (9)$$

Each of the voltage values, $U_{L0}$ and $U_{L1}$, may be stored. The difference between these values (i.e. between $U_{L0}$ and $U_{L1}$) may be used to compute the value of resistance $R+R_0$. From equation (1) above, $U_{L0}=U_S$. Therefore, $$U_{L0} - U_{L1} = U_S - U_{L1} \qquad (10)$$

This voltage difference between the two measurements can be rewritten as:

$$U_{L0} - U_{L1} = U_S - \left(U_S - (R + R_0 + R_{LC}) \cdot P_N \cdot \frac{U_{L1}}{U_N^2}\right) \qquad (11)$$

The voltage difference between the two measurements can be simplified as:

$$U_{L0} - U_{L1} = (R + R_0 + R_{LC}) \cdot P_N \cdot \frac{U_{L1}}{U_N^2} \qquad (12)$$

The resistance values can be isolated by:

$$R + R_0 + R_{LC} = \frac{U_N^2 * (U_{L0} - U_{L1})}{P_N \cdot U_{L1}} \qquad (13)$$

The resistance value $R+R_0$ (illustrated in the key to FIG. 2 as 3° and labeled as 212) can therefore be expressed as:

$$R + R_0 = \frac{U_N^2}{P_N \cdot U_{L1}} \cdot (U_{L0} - U_{L1}) - R_{LC} \qquad (14)$$

The $R+R_0$ value can be used in determining whether to reduce the maximum power of the device. As described above, if the voltage drop between both measurements is higher than a determined value (stored in appliance memory), the power may be reduced. The level of reduction may be directly proportional to the voltage drop. A practical real world triggering value may be about a 2% to 3% voltage drop. Various relevant decision level values could be stored in the appliance memory.

A method in accordance with exemplary embodiments may be described with reference to FIG. 3. A determination may be made at 302 as to whether the appliance is not plugged in. If it is plugged in, the process may wait for the appliance to be plugged out. If it is not plugged in, the appliance may enter a measurement mode at 303. The power consumption may be reduced to a minimum at 304 that allow device to perform voltage measurement and calculation. The voltage may be measured at the internal terminals of the appliance at 305 (i.e. the first measurement). The first measured voltage value may be stored at 306.

The power consumption in the appliance may be increased to a factory set default value at 307. This default value may be set during the manufacturing process (i.e. at the time of manufacture of the appliance). The voltage may be measured at the internal terminals of the appliance at 308 (i.e. the second measurement). The second measured voltage value may be stored at 309.

The supply wire resistance $R+R_0$ may be computed at 310 based on the stored values. The computed wire resistance ($R+R_0$) may be utilized to compute a maximum power consumption value of the appliance at 311. The maximum power consumption value as calculated herein may change if the appliance is plugged out and then plugged in. That is, each time the appliance is plugged in, the measurements as described are performed. The measurements may also be performed at a pre-determined interval such a particular time of the day, day of the month, etc.

Figure 3:
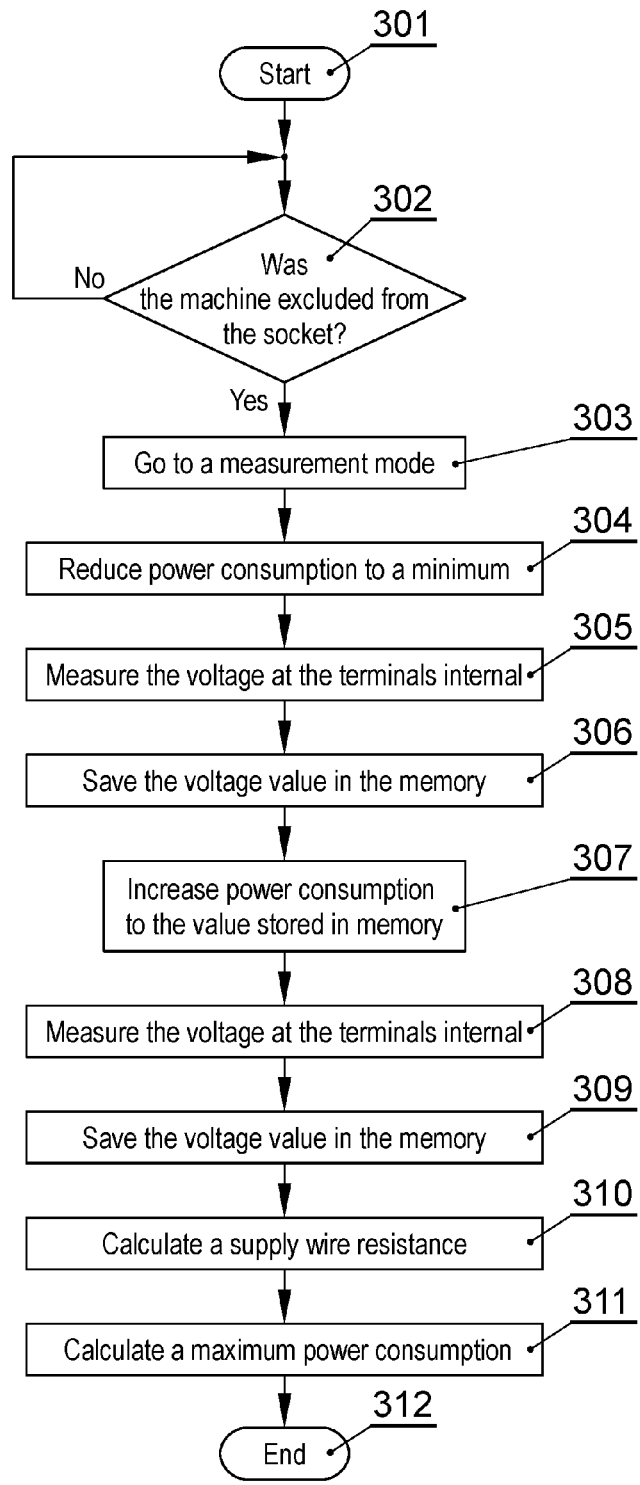
FIG. 3 illustrates a method in accordance with exemplary embodiments.

Method or process steps 304, 305 and 306 of FIG. 3 may correspond to equation (1) above. Steps 307, 308 and 309 may correspond to equation (2) above. Step 310 may correspond to equation (14) above.

Figure 1:
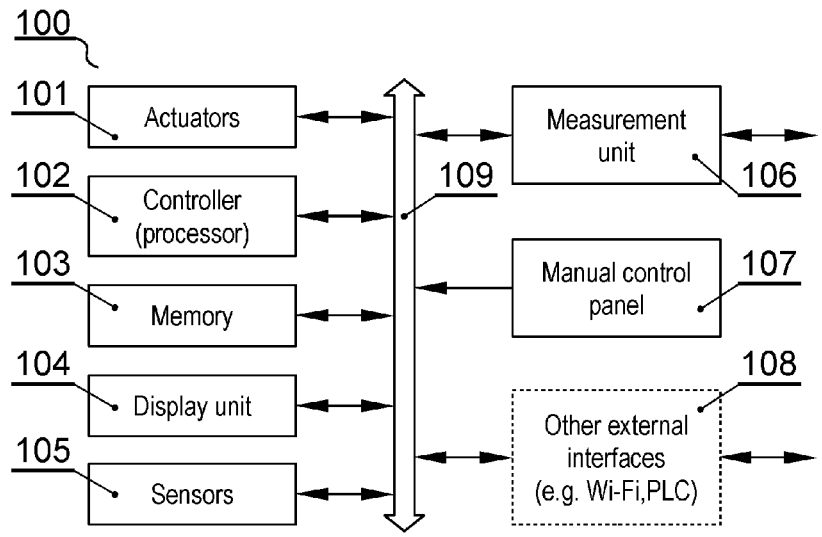
FIG. 1 illustrates a system in accordance with exemplary embodiments.

An apparatus in accordance with exemplary embodiments is illustrated in FIG. 1. Apparatus 100 may comprise a plurality of components such as actuators 101, controller 102, memory 103, display unit 104, sensors 105, measurement unit 106, manual control panel 107 and other external interfaces 108 such as Wi-Fi, PLC and the like. There can be one or more of some or all of these components associated with or implemented within apparatus 100.

Actuators 101 can be electro-mechanical elements that can be controlled electrically. Examples of actuators may include, but not limited to, electrically driven water valves, electric engines, pumps, flaps, and the like. All components of the appliance can be managed by controller/processor 102 in conjunction (or in co-operation) with memory 103. Memory 103 may store software, configuration data, pre-set data, results of measurements and readings data.

Display unit 104 may communicate status of the appliance to a user. It may consist of any kind of display such as a 4×7 segment LED display, LED or OLED numerical or matrix display for example. Sensors 105 allow the appliance to collect the data needed for proper operation. For example, sensors 105 could check or measure temperature, water level and the like.

Measurement unit 106 may measure voltage or other physical value on internal terminals or in other location within the appliance. Manual control panel 107 permits a user to control the appliance and may show the device status to the user. It may consist of buttons, switches, lamps, controls and any kind of touch screen or touch sensor. External interfaces unit 108 may communicate with a power supplier and/or devices' manufacturers by means of transmitting and receiving data via wires or radio connection. External interfaces unit 108 may also be used for local communication with other IoT (Internet of Things) home appliances present in a user premise.

A system bus 109 may facilitate interconnection and communication between two or more of the components of apparatus 100. Each of the components identified in apparatus 100 may be implemented within an appliance for which the maximum allowable power consumption is being determined according to exemplary embodiments.

Measurement unit 106 may measure the voltage at the internal terminals (twice). The measured voltage values may be stored in memory 103. The stored values may be utilized by a processor (not illustrated but associated with controller 102 for example) to compute a line resistance as described above. The processor may instruct the measuring unit to measure the voltage. It may instruct the memory unit to store the measured values.

The processor may further determine the maximum power consumption and preset values based on the computed line resistance and may utilize the values stored in memory 103 to compute the line resistance values. Measured voltages are used for grid resistance calculations. As optional equipment, external interfaces block 108 may be implemented.

The adjustment of maximum allowable power consumption value according to exemplary embodiments as described above provides multiple benefits. Wires used in the wiring system of the house can be protected from damage. A stable power consumption mechanism can be achieved. Since wire parameters are rather stable in a typical environment, as long as the appliance is plugged in, the measurements may not have to be repeated.

However, in some embodiments, the measurements may be repeated at a particular frequency such as at a particular time of the day, a particular day of the week, a particular date of the month, etc.

Apparatus and methods for measuring voltage drops to calculate wire resistances in an appliance has been described in accordance with exemplary embodiments.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A method for determining a power consumption of an appliance, said method comprising the steps of:
   reducing a power consumption of the appliance to a minimum value;
   measuring a first voltage value at an internal terminal of the appliance;
   increasing the power consumption of the appliance from the minimum value to a factory default value;
   measuring a second voltage value at the internal terminal of the appliance;
   computing a supply wire resistance based on the measured first and second voltage values; and
   determining a maximum allowable power consumption value of the appliance based on the computed supply wire resistance.

2. The method of claim 1, further comprising:
   storing the maximum allowable power consumption value.

3. The method of claim 1, further comprising:
   storing the first and second measured voltage values.

4. The method of claim 1, wherein the first measured voltage value is equal to a supply voltage.

5. The method of claim 4, wherein the second measured voltage value is a difference between the supply voltage and a sum of the voltage loss across external resistance, internal resistance and appliance resistance.

6. The method of claim 5, wherein the second measured voltage value is less than the first measured voltage value.

7. The method of claim 6, further comprising:
   computing a difference between the first and second measured voltage values.

8. The method of claim 7, further comprising:
   decreasing the maximum allowable power consumption value if the computed difference is greater than a pre-determined value.

9. The method of claim 7, further comprising:
   decreasing the maximum allowable power consumption value if the computed difference exceeds a pre-determined percentage value.

10. The method of claim 1, wherein the supply wire resistance includes an external wire resistance and an internal wire resistance.

11. The method of claim 1, further comprising:
    determining the maximum allowable power consumption of the appliance each time the appliance is plugged in after being plugged out.

12. The method of claim 1, further comprising:
determining the maximum allowable power consumption of the appliance at a pre-determined frequency.

13. The method of claim 12, wherein the predetermined frequency is once a day or once a week.

14. A system for determining a power consumption of an appliance, the system comprising:
- a measurement unit for measuring voltage values at internal terminals of the appliance;
- a memory for storing the measured voltage values and for storing a pre-set power consumption value of the appliance;
- a processor for
  - computing a supply wire resistance based on the measured voltage values,
  - determining a maximum allowable power consumption value of the appliance based on the computed supply wire resistance, and
- a communication bus for facilitating communication between the measurement unit, the memory and the processor.

15. The system of claim 14, wherein the processor further instructs the appliance to increase a power consumption to a factory default value.

16. The system of claim 14, wherein the processor further decreases the maximum allowable power consumption value if a difference between the first and second measured voltage value exceeds a pre-determined threshold value.

17. The system of claim 14, wherein the processor further decreases the maximum allowable power consumption value if a difference between the first and second measured voltage value exceeds a pre-determined percentage threshold value.

18. An appliance comprising:
- a measurement unit for measuring voltage values at internal terminals of the appliance;
- a memory for storing the measured voltage values and for storing a pre-set power consumption value of the appliance;
- a processor for
  - computing a supply wire resistance based on the measured voltage values,
  - determining a maximum allowable power consumption value of the appliance based on the computed supply wire resistance, and
- a communication bus for facilitating communication between the measuring unit, the memory and the processor.

19. The applicant of claim 18, wherein the appliance is at least one of a water heater, a clothes dryer, a kettle, a dishwasher and an induction stove.

* * * * *